(12) United States Patent
Motoyama (10) Patent No.: US 12,244,285 B2
(45) Date of Patent: Mar. 4, 2025

(54) LC FILTER, AND DIPLEXER AND MULTIPLEXER USING SAME

(71) Applicant: Murata Manufacturing Co., Ltd., Nagaokakyo (JP)

(72) Inventor: Hiroto Motoyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 353 days.

(21) Appl. No.: 17/964,082

(22) Filed: Oct. 12, 2022

(65) Prior Publication Data

US 2023/0029621 A1 Feb. 2, 2023

Related U.S. Application Data

(63) Continuation of application No. PCT/JP2021/016621, filed on Apr. 26, 2021.

(30) Foreign Application Priority Data

May 25, 2020 (JP) ................. 2020-090702

(51) Int. Cl.
*H03H 7/01* (2006.01)
*H03H 7/12* (2006.01)
(Continued)

(52) U.S. Cl.
CPC ............ *H03H 7/1791* (2013.01); *H03H 7/12* (2013.01); *H03K 17/51* (2013.01); *H03H 2001/0085* (2013.01)

(58) Field of Classification Search
CPC .. H03H 7/1791; H03H 7/1741; H03H 7/1766; H03H 7/1775; H03H 7/1758;
(Continued)

(56) References Cited

U.S. PATENT DOCUMENTS 5,896,073 A 4/1999 Miyazaki et al.
12,040,767 B2 * 7/2024 Masuda ................... H01G 4/30
(Continued)

FOREIGN PATENT DOCUMENTS

CN 102647165 A 8/2012
EP 2 009 787 A1 12/2008
(Continued)

OTHER PUBLICATIONS

International Search Report in PCT/JP2021/016621, mailed Jul. 13, 2021, 3 pages.
(Continued)

*Primary Examiner* — Stephen E. Jones
(74) *Attorney, Agent, or Firm* — Keating & Bennett, LLP (57) ABSTRACT

An LC filter includes a multilayer body, plate electrodes, capacitor electrodes, and inductor vias. The capacitor electrodes each define a capacitor between the plate electrode and a corresponding one of the capacitor electrodes. A first inductor via is connected between a first capacitor electrode and a first plate electrode. A second inductor via is connected between a second capacitor electrode and the first plate electrode. A third inductor via is connected between a third capacitor electrode and the first plate electrode. A fourth capacitor electrode faces the first and second capacitor electrodes. A fifth capacitor electrode faces the second and third capacitor electrodes. A sixth capacitor electrode faces the first and third capacitor electrodes.

20 Claims, 9 Drawing Sheets

(51) Int. Cl.
*H03K 17/51* (2006.01)
*H03H 1/00* (2006.01)

(58) Field of Classification Search
CPC .. H03H 7/12; H03H 7/17; H03H 7/01; H03H 2001/0085
See application file for complete search history.

(56) References Cited

U.S. PATENT DOCUMENTS

2007/0241839 A1  10/2007  Taniguchi
2017/0093358 A1   3/2017  Imamura

FOREIGN PATENT DOCUMENTS

| JP | 09232809 A   | 9/1997 |
| JP | 2006140634 A | 6/2006 |
| JP | 2010062260 A | 3/2010 |
| JP | 2017063394 A | 3/2017 |

OTHER PUBLICATIONS

Written Opinion in PCT/JP2021/016621, mailed Jul. 13, 2021, 3 pages.
Office Action in CN202180030121.9, mailed Oct. 16, 2023, 9 pages.

* cited by examiner

Y–Δ TRANSFORM

FIG.13

LC FILTER, AND DIPLEXER AND MULTIPLEXER USING SAME

CROSS REFERENCE TO RELATED APPLICATIONS

This application claims the benefit of priority to Japanese Patent Application No. 2020-090702 filed on May 25, 2020 and is a Continuation Application of PCT Application No. PCT/JP2021/016621 filed on Apr. 26, 2021. The entire contents of each application are hereby incorporated herein by reference.

BACKGROUND OF THE INVENTION

1. Field of the Invention

The present disclosure relates to an LC filter, and a diplexer and a multiplexer including the same, and more particularly, to technology to improve an attenuation characteristic in a multilayer LC filter.

2. Description of the Related Art

Japanese Unexamined Patent Application Publication No. 2010-062260 discloses the following configuration. In a multilayer LC filter having resonant circuits in two stages connected in series between an input terminal and an output terminal, capacitive elements for adjusting characteristics are formed by forming belt-shaped patterns on conductor patterns for forming capacitive elements and inductive element, and further an inductive element for adjusting characteristics is formed by forming zigzag vias between the two-stage resonant circuits. In the LC filter in Japanese Unexamined Patent Application Publication No. 2010-062260, the capacitive elements and the inductive element for adjusting characteristics can be formed without adding a new dielectric layer. This enables an increase in chip size to be suppressed and filter performance such as an attenuation characteristic to be improved.

Typically, to reduce noise and loss of a signal passing through a filter in a filter device used for communication equipment, ensuring attenuation outside the pass band of the filter is important.

In recent years, higher frequencies and wider bands in frequency bands used for communication have been promoted in communication standards for Wi-Fi, the fifth generation mobile communication system (5G), and the like. For example, a pass band width of 2 GHz to 6 GHz is required for a pass band. In contrast, a plurality of communication standards are assigned different pass bands, and thus making a band between adjacent used pass bands as narrow as possible (for example, several hundred MHz) is required. That is, a filter device for which a wide pass band is achieved and that has a high attenuation characteristic regarding a signal in a non-pass band is desired.

SUMMARY OF THE INVENTION

Preferred embodiments of the present invention provide multilayer LC filters that each improve loss of a signal in a pass band and attenuation characteristics in a non-pass band are achieved.

An LC filter according to a preferred embodiment of the present invention includes a multilayer body including a plurality of dielectric layers that are stacked, a first electrode, a second electrode, first, second, third, fourth, fifth, and sixth capacitor electrodes, and first, second, and third inductor vias. The first electrode and the second electrode have a plate shape and are provided in different dielectric layers in the multilayer body. The first, second, and third capacitor electrodes each define a capacitor between the second electrode and a corresponding one of the first, second, and third capacitor electrodes. The first inductor via includes one end connected to the first capacitor electrode and another end coupled to the first electrode. The second inductor via includes one end connected to the second capacitor electrode and another end connected to the first electrode. The third inductor via includes one end connected to the third capacitor electrode and another end coupled to the first electrode. The fourth capacitor electrode faces the first capacitor electrode and the second capacitor electrode. The fifth capacitor electrode faces the second capacitor electrode and the third capacitor electrode. The sixth capacitor electrode faces the third capacitor electrode and the first capacitor electrode.

The LC filter according to the above-described preferred embodiment of the present invention has a configuration electrically corresponding to a configuration in which resonant circuits in two stages connected in series and another resonant circuit connected in parallel to the resonant circuits in two stages connected in series are provided. Further, in the configuration, the fourth, fifth, and sixth capacitor electrodes cause mutual capacitive coupling of the capacitor electrodes (the first, second, and third capacitor electrodes) defining the resonant circuits. Since each inductor defining and functioning as a component of a corresponding one of the resonant circuits are provided from a via, loss at the time of transmitting a signal can be improved. In addition, cross-coupling caused by another resonant circuit enables an attenuation pole to be added. Accordingly, loss of a signal in the pass band can be improved, and attenuation characteristics in the non-pass band can also be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present disclosure will be described in detail with reference to the drawings. The same components or corresponding portions are denoted by the same reference numerals throughout the drawings, and description thereof is not repeated.

Preferred Embodiment 1

Filter Configuration

Figure 1:
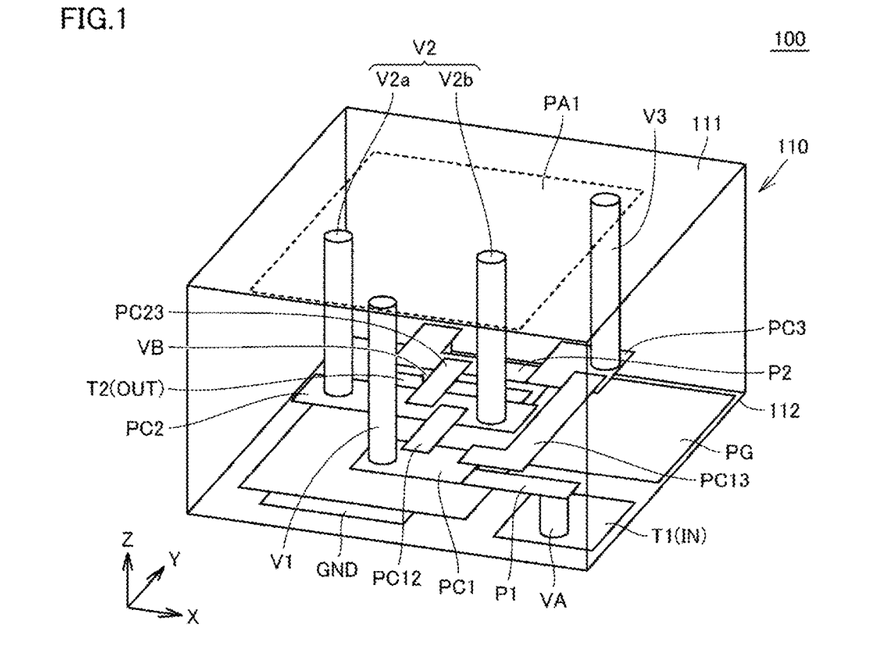
FIG. 1 is an oblique perspective view of an LC filter according to Preferred Embodiment 1 of the present invention.
Figure 2:
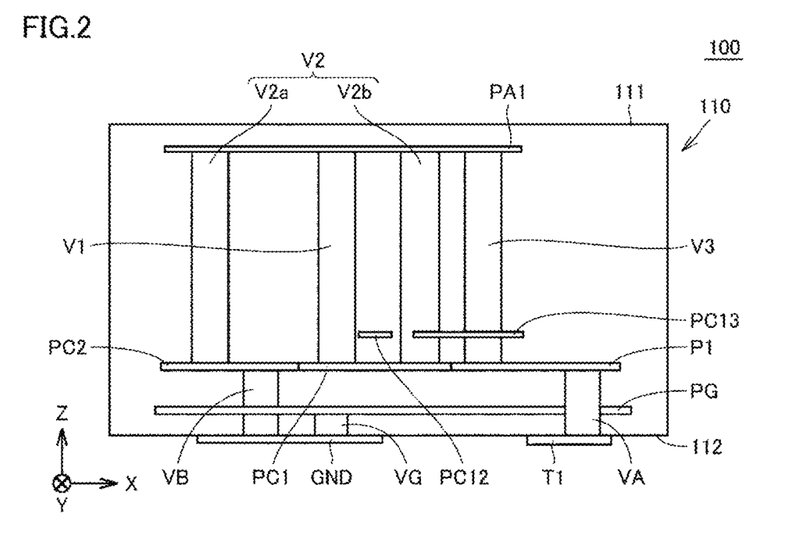
FIG. 2 is a side perspective view of the LC filter in FIG. 1.

The configuration of an LC filter 100 according to Preferred Embodiment 1 will be described by using FIG. 1 and FIG. 2. FIG. 1 is an oblique perspective view of the LC filter 100. FIG. 2 is a side perspective view of the LC filter. The LC filter 100 described in Preferred Embodiment 1 is a low pass filter that allows signals in a frequency band lower than a specific frequency to pass.

The LC filter 100 includes a multilayer body 110 having a rectangular parallelepiped or substantially a rectangular parallelepiped shape including a plurality of dielectric layers that are stacked in a stacking direction. Each dielectric layer of the multilayer body 110 is made of, for example, a ceramic. In the multilayer body 110, inductors and capacitors defining LC resonant circuits are defined by a plurality of wiring patterns and electrodes provided in the dielectric layers and a plurality of vias between the dielectric layers.

In the description below, a stacking direction of the multilayer body 110 is a "Z-axis direction", a direction along one of sides of the multilayer body 110 that are perpendicular or substantially perpendicular to the Z-axis direction is an "X-axis direction", and a direction along the other perpendicular or substantially perpendicular side of the multilayer body 110 is a "Y-axis direction". In addition, a positive direction and a negative direction of the Z-axis in the drawings are hereinafter respectively referred to as an upper side and a lower side on occasions.

In FIG. 1, FIG. 2, FIG. 6, FIG. 8, FIG. 10, and FIG. 12 (described later), dielectrics of the multilayer body 110 are omitted, and only wiring patterns, vias, the electric conductors of terminals that are provided therein are illustrated.

With reference to FIG. 1 and FIG. 2, the LC filter 100 includes the multilayer body 110, an input terminal T1, an output terminal T2, inductor vias V1 to V3, and capacitor electrodes PC1 to PC3.

The multilayer body 110 includes an upper surface 111 and a lower surface 112. External terminals (the input terminal T1, the output terminal T2, and a ground terminal GND) to connect the LC filter 100 to external equipment are electrodes having a plate shape and are land grid array (LGA) terminals disposed regularly on the lower surface 112 of the multilayer body 110.

A plate electrode PG is provided in the dielectric layer near the lower surface 112 of the multilayer body 110. As illustrated in FIG. 2, the plate electrode PG is connected to the ground terminal GND of the lower surface 112 with a via VG interposed therebetween. In addition, a plate electrode PA1 is provided in the dielectric layer near the upper surface 111 of the multilayer body 110. In a plan view from the stacking direction (Z-axis direction) of the multilayer body 110, the plate electrode PA1 has a rectangular or substantially rectangular shape. In FIG. 1, the plate electrode PA1 is represented by the broken line.

The capacitor electrodes PC1 to PC3 having a plate shape are provided in the dielectric layers between the plate electrode PA1 and the plate electrode PG. The capacitor electrodes PC1 to PC3 are spaced away from the plate electrode PG and each define a capacitor between the plate electrode PG and a corresponding one of the capacitor electrodes PC1 to PC3.

The capacitor electrode PC1 is connected to the input terminal T1 with a wiring electrode P1 and a via VA interposed therebetween. The inductor via V1 is connected between the capacitor electrode PC1 and the plate electrode PA1. The inductor via V1 and the capacitor electrode PC1 define a resonant circuit.

The inductor via V2 is connected between the capacitor electrode PC2 and the plate electrode PA1. The inductor via V2 includes via conductors V2a and V2b each extending in the stacking direction of the multilayer body 110. The via conductors V2a and V2b are connected in parallel between the capacitor electrode PC2 and the plate electrode PA1. The inductor via V2 (via conductors V2a and V2b) and the capacitor electrode PC2 define a resonant circuit.

The capacitor electrode PC3 is connected to the output terminal T2 with a wiring electrode P2 and a via VB interposed therebetween. An inductor via V3 is connected between the capacitor electrode PC3 and the plate electrode PA1. The inductor via V3 and the capacitor electrode PC3 define a resonant circuit.

The LC filter 100 further includes capacitor electrodes PC12, PC13, and PC23 causing mutual capacitive coupling between the capacitor electrodes PC1 to PC3. In the multilayer body 110, the capacitor electrodes PC12, PC13, and PC23 are provided in a dielectric layer (second dielectric layer) between the dielectric layer including the plate electrode PA1 provided therein and a dielectric layer (first dielectric layer) including the capacitor electrodes PC1 to PC3 provided therein.

The capacitor electrode PC12 faces the capacitor electrode PC1 and the capacitor electrode PC2. The capacitor electrode PC12 causes capacitive coupling between the capacitor electrode PC1 and the capacitor electrode PC2. The capacitor electrode PC13 faces the capacitor electrode PC1 and the capacitor electrode PC3. The capacitor electrode PC13 causes capacitive coupling between the capacitor electrode PC1 and the capacitor electrode PC3. The capacitor electrode PC23 faces the capacitor electrode PC2 and the capacitor electrode PC3. The capacitor electrode PC23 causes capacitive coupling between the capacitor electrode PC2 and the capacitor electrode PC3.

Figure 3:
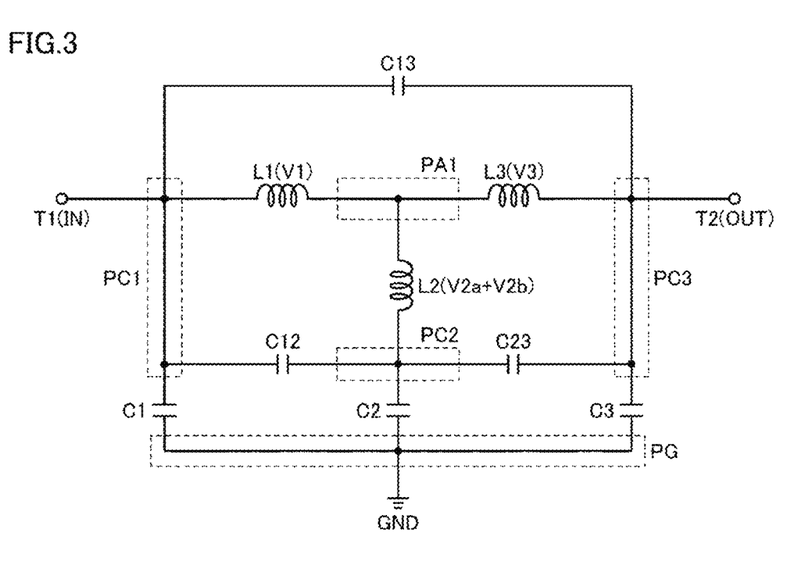
FIG. 3 is an equivalent circuit diagram of the LC filter in FIG. 1.

FIG. 3 is an equivalent circuit diagram of the LC filter 100 illustrated in FIG. 1. In FIG. 3, connection portions represented by the broken lines respectively correspond to the plate electrodes PA1 and PG in FIG. 1 and the capacitor electrodes PC1 to PC3.

The input terminal T1 is connected to the capacitor electrode PC1. A capacitor C1 is provided between the capacitor electrode PC1 and the plate electrode PG connected to the ground terminal GND. An inductor L1 is connected between the capacitor electrode PC1 and the plate electrode PA1. The inductor L1 corresponds to the inductor via V1.

An inductor L2 is connected between the plate electrode PA1 and the capacitor electrode PC2. The inductor L2 corresponds to the inductor via V2 (via conductors V2a and V2b). A capacitor C2 is provided between the capacitor electrode PC2 and the plate electrode PG.

The output terminal T2 is connected to the capacitor electrode PC3. A capacitor C3 is provided between the capacitor electrode PC3 and the plate electrode PG. An inductor L3 is connected between the capacitor electrode PC3 and the plate electrode PA1. The inductor L3 corresponds to the inductor via V3.

A capacitor C12 is provided between the capacitor electrode PC1 and the capacitor electrode PC2. The capacitor C12 is defined by capacitive coupling between the capacitor electrode PC1 and the capacitor electrode PC12 and capacitive coupling between the capacitor electrode PC12 and the capacitor electrode PC2.

A capacitor C23 is provided between the capacitor electrode PC2 and the capacitor electrode PC3. The capacitor C23 is defined by capacitive coupling between the capacitor electrode PC2 and the capacitor electrode PC23 and capacitive coupling between the capacitor electrode PC23 and the capacitor electrode PC3.

A capacitor C13 is provided between the capacitor electrode PC1 and the capacitor electrode PC3. The capacitor C13 is defined by capacitive coupling between the capacitor electrode PC1 and the capacitor electrode PC13 and capacitive coupling between the capacitor electrode PC13 and the capacitor electrode PC3.

Figure 4A:
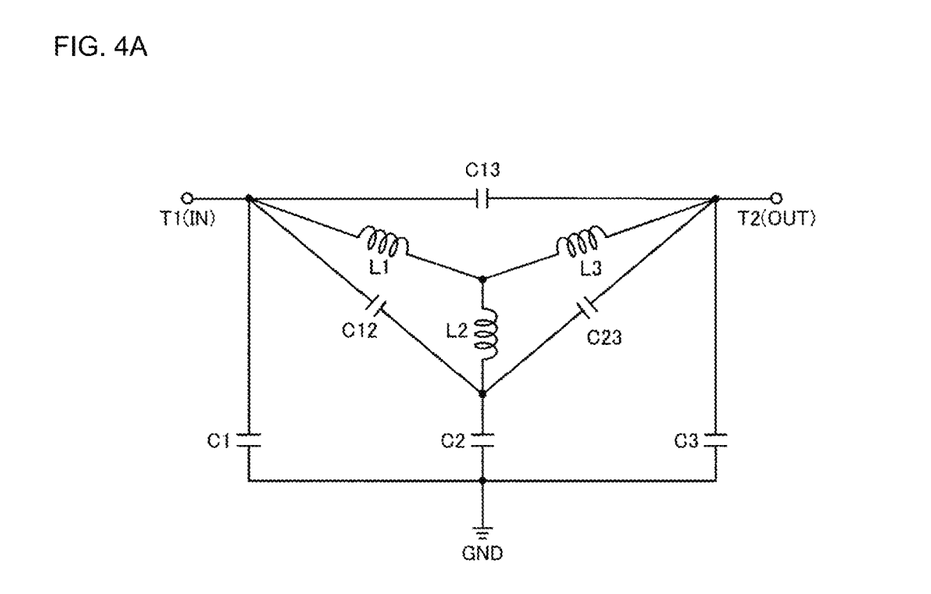
FIGS. 4A and 4B illustrate diagrams for explaining the circuit conversion of the equivalent circuit in FIG. 3.
Figure 4B:
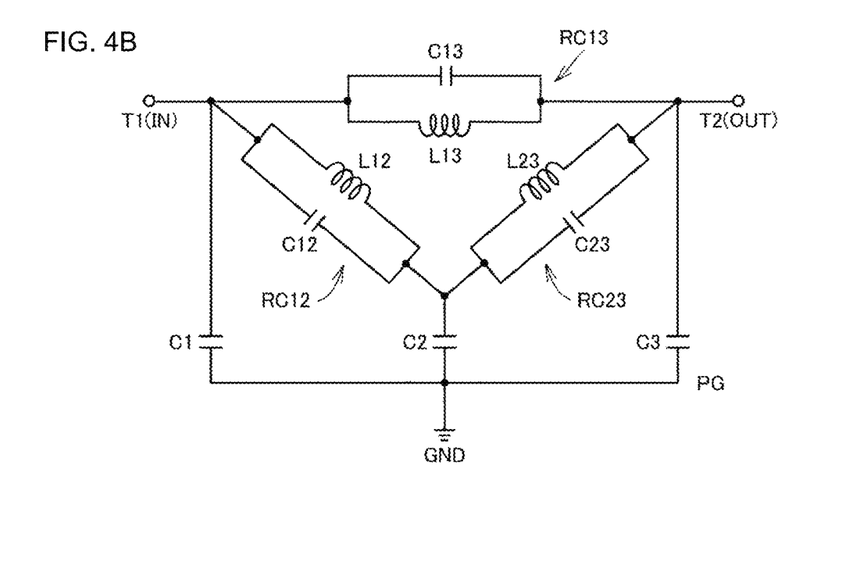

FIGS. 4A and 4B is a diagram for explaining the electrical circuit conversion of the equivalent circuit illustrated in FIG. 3. With reference to FIGS. 4A and 4B, as illustrated in FIG. 4A, the equivalent circuit of the LC filter 100 illustrated in FIG. 3 schematically has a configuration in which the capacitors C12, C13, and C23 in A connection and the inductors L1, L2, and L3 in Y connection are connected between the input terminal T1 and the output terminal T2. Y-Δ transform of the inductors in the Y connection in the configuration in FIG. 4A results in a configuration in which each inductor is connected in parallel to a corresponding one of the capacitors C12, C13, and C23. That is, as illustrated in FIG. 4B, conversion is performed to the configuration in which three resonant circuits in A connection are connected between the input terminal T1 and the output terminal T2.

Specifically, the conversion is performed to a configuration in which a resonant circuit RC12 defined by an inductor L12 and the capacitor C12 and a resonant circuit RC23 defined by an inductor L23 and the capacitor C23 are connected in series between the input terminal T1 and the output terminal T2 and further a resonant circuit RC13 defined by an inductor L13 and the capacitor C13 is connected between the input terminal T1 and the output terminal T2. That is, the configuration of the LC filter 100 corresponds to a configuration in which cross-coupling using the resonant circuit RC13 is added to the LC filter defined by the resonant circuits RC12 and RC23 in two stages.

The resonant circuit RC13 used for the cross-coupling enables an addition of an attenuation pole. For this reason, an attenuation characteristic in the non-pass band can be improved as compared with an LC filter in a configuration without the cross-coupling.

As described with reference to FIG. 1 and FIG. 2, in the LC filter 100, the inductors of the resonant circuits are defined by the vias extending in the stacking direction of the multilayer body, and the inductors are electrically connected to the shared plate electrode PA1. With the configuration as described above, as compared with a case where inductors are provided on the plane of the dielectric layer, loss due to the inductors can be reduced, and further loss in a signal transmission path between the resonant circuits can also be reduced. Loss in the pass band can thus be reduced.

The "plate electrode PA1" and the "plate electrode PG" in Preferred Embodiment 1 respectively correspond to a "first electrode" and a "second electrode". The "capacitor electrode PC1" to the "capacitor electrode PC3", the "capacitor electrode PC12", the "capacitor electrode PC23", and the "capacitor electrode PC13" in Preferred Embodiment 1 respectively correspond to a "first capacitor electrode" to a "sixth capacitor electrode".

Filter Characteristics

Figure 5:
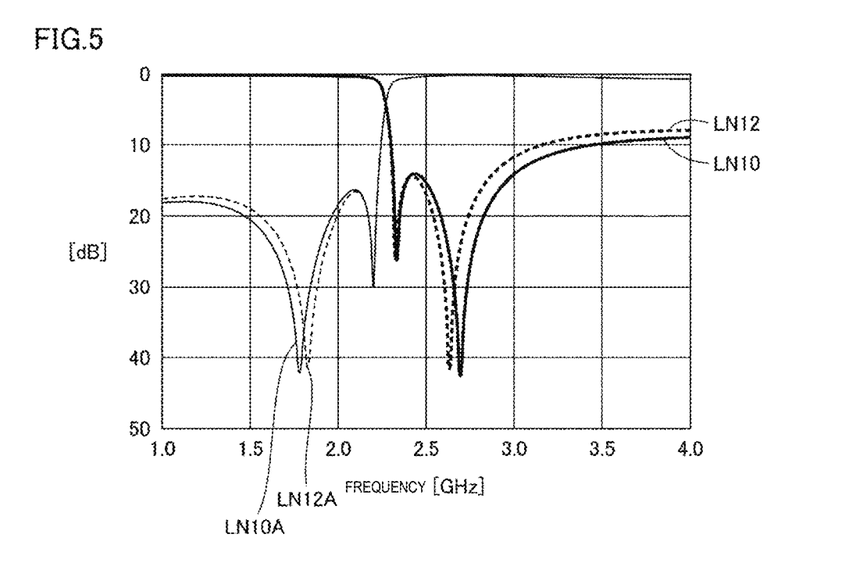
FIG. 5 is a graph for explaining the bandpass characteristics of the LC filter in FIG. 1.

Results of a simulation of the bandpass characteristics of the LC filter 100 in Preferred Embodiment 1 will be described using FIG. 5. In FIG. 5, the horizontal axis represents frequency, and the vertical axis represents insertion loss (a solid line LN10 and a broken line LN12) and return loss (a solid line LN10A and a broken line LN12A) of the LC filter. The pass band of the LC filter in the simulation example in FIG. 5 ranges from about 0 MHz to about 2200 MHz.

First, a case where the same or substantially the same inductance value and the same or substantially the same resistance value are set for the inductors L1 to L3 in the equivalent circuit diagram in FIG. 3 will be described with reference to FIG. 5. In an example, the inductance of the inductors L1 to L3 is about 1.33 nH, and the resistance value is set at about 0.133Ω. In this example, for insertion loss (solid line LN10), about 10 dB is achieved in the end portion (2300 MHz) on the high frequency side of the pass band. In a non-pass band on a higher frequency side than the pass band, about 43 dB is obtained as the attenuation characteristic. The reflection characteristic (solid line LN10A) is lower than about 15 dB over the entire pass band.

Next, a case where the inductance and the resistance value of the inductor L2 is made lower than those of the inductors L1 and L3 as in the LC filter 100 in FIG. 1 will be described. In the example in FIG. 5, the inductance and the resistance value of each of the inductors L1 and L3 are respectively set at about 1.2 nH and about 0.12Ω, and the inductance and the resistance value of the inductor L2 are respectively set at about 0.4 nH and about 0.04Ω. In this example, regarding both of the insertion loss (broken line LN12) and the return loss (broken line LN12A), the same or approximately the same degree of the bandpass characteristics as those in the case where the same inductance value and the same or value are set are also obtained.

As described above, by applying, to the LC filter (low pass filter), the configuration in which the cross-coupling using the resonant circuits is added between the input terminal and the output terminal, loss of signals in the pass band can be improved, and the attenuation characteristic in the non-pass band can also be improved.

Further, as illustrated in FIG. 5, the inductance of the inductor (inductor L2) not connected to the input and output terminals is lower than those of the inductors (inductors L1 and L3) connected to the input and output terminals (that is, the inductance of each of the inductors L1 and L3 is made higher than that of the inductor L2), equivalent bandpass characteristics can be achieved, and the apparatus downsizing can also be achieved.

Modifications

For the LC filter 100 in Preferred Embodiment 1, the configuration in which the inductance of the inductor via V2 is lower than those of the inductor vias V1 and V3 by providing the inductor via V2 by the two via conductors V2a and V2b has heretofore been described.

In Modification 1, Modification 2, and Modification 3 of preferred embodiments of the present invention below, other configurations will be described in which the inductance of the inductor via V2 is lower than those of the inductor vias V1 and V3 by changing the shape of the shared plate electrode to which the inductor vias are electrically connected or by providing additional inductors.

Modification 1

Figure 6:
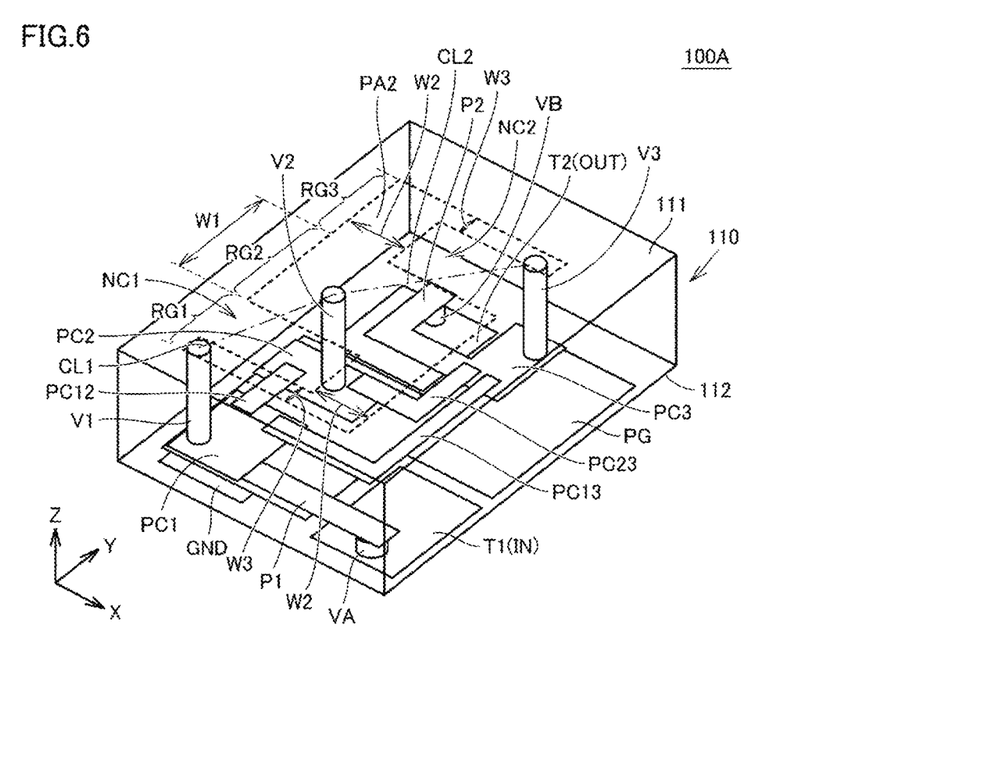
FIG. 6 is an oblique perspective view of an LC filter in Modification 1 of a preferred embodiment of the present invention.
Figure 7:
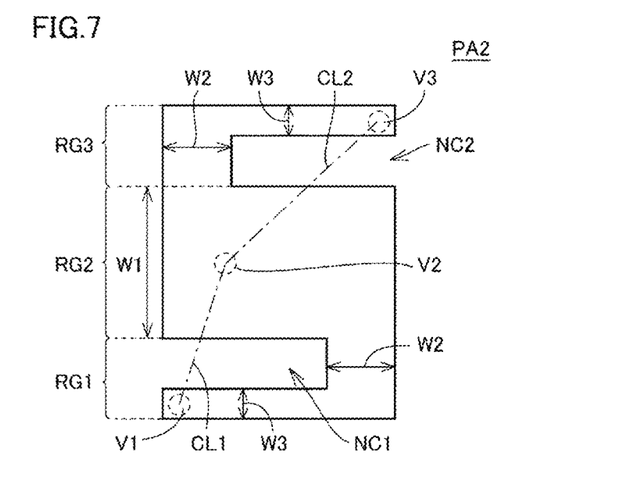
FIG. 7 is a plan view of a plate electrode PA2 in FIG. 6.

FIG. 6 is an oblique perspective view of a LC filter 100A according to Modification 1 of a preferred embodiment of the present invention. As compared with the LC filter 100 in Preferred Embodiment 1, the LC filter 100A in Modification 1 has a configuration in which the inductor via V2 is defined by one via conductor like the inductor vias V1 and V3 and the plate electrode PA1 is replaced with a plate electrode PA2. Although the other components have a partially different electrode configuration and/or shape, the LC filter 100A has the same or substantially the same configuration. In the LC filter 100A, the description of the same components as those of the LC filter 100 is not repeated. FIG. 7 is a plan view of the plate electrode PA2 in FIG. 6.

With reference to FIG. 6 and FIG. 7, in the plan view from the stacking direction of the multilayer body 110, the plate electrode PA2 in the LC filter 100A has an S-letter shape or substantially an S-letter shape. The plate electrode PA2 includes a rectangular or substantially rectangular region RG2 located near the center of the plate electrode PA2 and L-letter-shaped regions RG1 and RG3 connected to both ends of the region RG2 in the Y-axis direction. To ensure symmetry in the filter characteristics, the plate electrode PA2 preferably has a shape with point symmetry with respect to the center of the rectangular or substantially rectangular region RG2.

The inductor via V1 is connected to the tip end portion of the region RG1. The inductor via V2 is connected to the region RG2. The inductor via V3 is connected to the tip end portion of the region RG3.

In the plate electrode PA2, a cutout portion NC1 is provided in a portion between the region RG1 and the region RG2, and a cutout portion NC2 is provided in a portion between the region RG2 and the region RG3. In the plan view from the stacking direction of the multilayer body 110, the cutout portion NC1 is configured so as to cross a linear path connecting the inductor via V1 and the inductor via V2 (a virtual line CL1 in FIG. 6 and FIG. 7). Similarly, the cutout portion NC2 is configured so as to cross a linear path connecting the inductor via V2 and the inductor via V3 (a virtual line CL2 in FIG. 6 and FIG. 7).

The L-letter-shaped region RG1 is provide such that the line width thereof is gradually narrowed from the point of connection with the inductor via V2 toward the point of connection with the inductor via V1. Similarly, the region RG3 is provided such that the line width thereof is gradually narrowed from the point of connection with the inductor via V2 toward the point of connection with the inductor via V3. In the example in FIG. 6, each of the regions RG1 and RG3 includes a first portion having a line width W2 and a second portion having a line width W3 narrower than the line width W2 (W2>W3). The minimum width of the width W3 in each of the regions RG1 and RG3 is narrower than the minimum width of the width W1 of the region RG2.

By shaping the plate electrode PA2 in this manner, the regions RG1 and RG3 can be regarded as inductors provided on the plane of the dielectric layer. Accordingly, even if the inductor via V2 is defined by one via conductor, the inductance of a path from the capacitor electrode PC1 to the region RG2 (the inductor via V1+the region RG1) and the inductance of a path from the capacitor electrode PC3 to the region RG2 (the inductor via V3+the region RG1) can be higher than the inductance of the inductor via V2. In other words, the inductance of the inductor via V2 can be made lower than the inductances of the respective paths to the region RG2 via the inductor vias V1 and V3. Since the number of via conductors defining the inductor via V2 can be decreased, the filter characteristics equivalent to those of the LC filter 100 in Preferred Embodiment 1 can be maintained, and further downsizing can also be achieved.

The "plate electrode PA2" in Modification 1 corresponds to the "first electrode". The "cutout portion NC1" and the "cutout portion NC2" in Modification 1 respectively correspond to a "first cutout portion" and a "second cutout portion".

Modification 2

Figure 8:
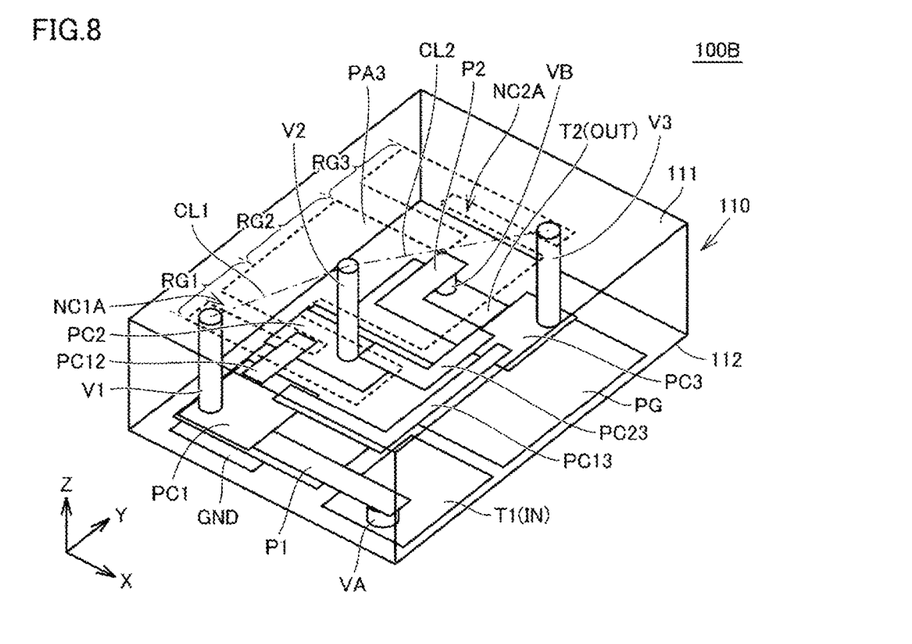
FIG. 8 is an oblique perspective view of an LC filter in Modification 2 of a preferred embodiment of the present invention.
Figure 9:
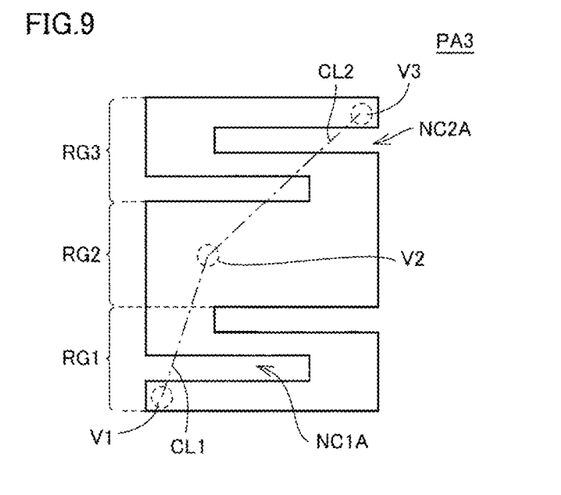
FIG. 9 is a plan view of a plate electrode PA3 in FIG. 8.

FIG. 8 is an oblique perspective view of a LC filter 100B according to Modification 2 of a preferred embodiment of the present invention. As compared with the LC filter 100 in Preferred Embodiment 1, the LC filter 100B in Modification 2 has a configuration in which the inductor via V2 is defined by one via conductor similar to the inductor vias V1 and V3 and the plate electrode PA1 is replaced with a plate electrode PA3. Although the other components have partially different electrode disposition and/or shape, the LC filter 100B has the same or substantially the same configuration. In the LC filter 100B, the description of the same or corresponding components as those of the LC filter 100 is not repeated. FIG. 9 is a plan view of the plate electrode PA3 in FIG. 8.

With reference to FIG. 8 and FIG. 9, similar to the plate electrode PA2 in the LC filter 100A in Modification 1, the plate electrode PA3 in the LC filter 100B includes the rectangular or substantially rectangular region RG2 and the regions RG1 and RG3 connected to both ends of the region RG2 in the Y-axis direction. The regions RG1 and RG3 of the plate electrode PA3 have a meandering shape. To ensure symmetry in the filter characteristics, the plate electrode PA3 also preferably has a shape with point symmetry with respect to the center of the rectangular region RG2.

The inductor via V1 is connected to the tip end portion of the region RG1. The inductor via V2 is connected to the region RG2. The inductor via V3 is connected to the tip end portion of the region RG3.

In the plate electrode PA3, at least one cutout portion is provided in the respective meandering portions of the regions RG1 and RG3. In the plan view from the stacking direction of the multilayer body 110, a cutout portion NC1 is configured so as to cross the linear path connecting the inductor via V1 and the inductor via V2 (the virtual line CL1 in FIG. 8 and FIG. 9). Similarly, a cutout portion NC2 is configured so as to cross the linear path connecting the inductor via V2 and the inductor via V3 (the virtual line CL2 in FIG. 8 and FIG. 9).

In the plate electrode PA3, the minimum width in each of the regions RG1 and RG3 is also narrower than the minimum width in the region RG2. The regions RG1 and RG3 of the plate electrode PA3 can thus be regarded as inductors provided on the plane of the dielectric layer. Accordingly, similar to the LC filter 100A in Modification 1, the inductances of the respective paths to the region RG2 via the inductor vias V1 and V3 can be higher than the inductance of the inductor via V2. In other words, the inductance of the inductor via V2 can be made lower than the inductances of the respective paths to the region RG2 via the inductor vias V1 and V3. Accordingly, for the LC filter 100B in Modification 2, the filter characteristics the same as or similar to those of the LC filter 100 in Preferred Embodiment 1 can also be maintained, and further downsizing can also be achieved.

The "plate electrode PA3" in Modification 2 corresponds to the "first electrode". The "cutout portion NC1A" and the "cutout portion NC2A" in Modification 2 respectively correspond to the "first cutout portion" and the "second cutout portion".

Modification 3

Figure 10:
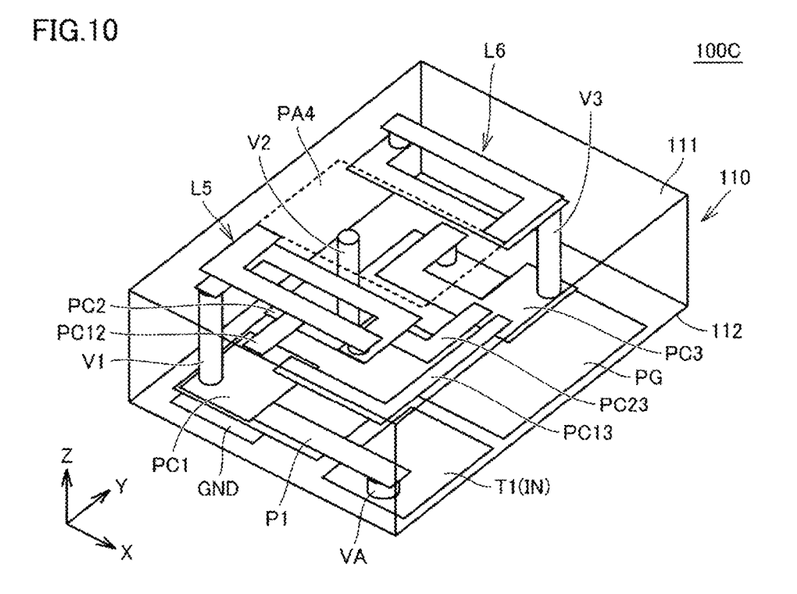
FIG. 10 is an oblique perspective view of an LC filter in Modification 3 of a preferred embodiment of the present invention.

FIG. 10 is an oblique perspective view of a LC filter 100C according to Modification 3 of a preferred embodiment of the present invention. As compared with the LC filter 100 in Preferred Embodiment 1, the LC filter 100C in Modification 3 has a configuration in which the inductor via V2 is defined by one via conductor similar to the inductor vias V1 and V3 and the plate electrode PA1 is replaced with a plate electrode PA4. Further, the LC filter 100C is provided with an inductor L5 connected between the inductor via V1 and the plate electrode PA4 and an inductor L6 connected between the inductor via V3 and the plate electrode PA4. Although the other components have partially different electrode disposition and/or shape, the LC filter 100C has the same or substantially the same configuration. In the LC filter 100C, the description of the same or corresponding components as those of the LC filter 100 is not repeated.

With reference to FIG. 10, the plate electrode PA4 in the LC filter 100C has a rectangular or substantially rectangular shape and has the same size or substantially the same size as that of the region RG2 in Modifications 1 and 2. In the example in FIG. 10, the inductors L5 and L6 extends over a plurality of dielectric layers and has a coil shape with a winding axis extending in the stacking direction of the multilayer body 110. One end of the inductor L5 is connected to the inductor via V1, and the other end is connected to the plate electrode PA4. One end of the inductor L6 is connected to the inductor via V3, and the other end is connected to the plate electrode PA4.

The inductors L5 and L6 may be, for example, a coil provided on the plane of one dielectric layer or may be a coil having a winding axis extending in the X-axis or Y-axis direction. The plate electrode PA4 may also have the same size or substantially the same size as that of the plate electrode PA1 in Preferred Embodiment 1, and the inductors L5 and L6 may be provided in a layer different from that of the plate electrode PA4.

As described above, the additional inductors connected in series are each provided between the plate electrode PA4 to which the inductor via V2 is connected and a corresponding one of the inductor vias V1 and V3, and thus the inductance of a path from the capacitor electrode PC1 to the plate electrode PA4 (the inductor via V1+the inductor L5) and the inductance of a path from the capacitor electrode PC3 to the plate electrode PA4 (the inductor via V3+the inductor L6) can be higher than the inductance of the inductor via V2. In other words, the inductance of the inductor via V2 can be made lower than the inductances of the respective paths to the region RG2 via the inductor vias V1 and V3. Accordingly, for the LC filter 100C in Modification 3, the filter characteristics the same or substantially the same as those of the LC filter 100 in Preferred Embodiment 1 can also be maintained, and further downsizing can also be achieved.

The "plate electrode PA4" in Modification 3 corresponds to the "first electrode". The "inductor L5" and the "inductor L6" in Modification 3 respectively correspond to a "first coil" and a "second coil".

Preferred Embodiment 2

In Preferred Embodiment 2 of the present invention, a configuration in which the LC filter described in any one of Preferred Embodiment 1 and the modifications is applied to a diplexer will be described.

Figure 11:
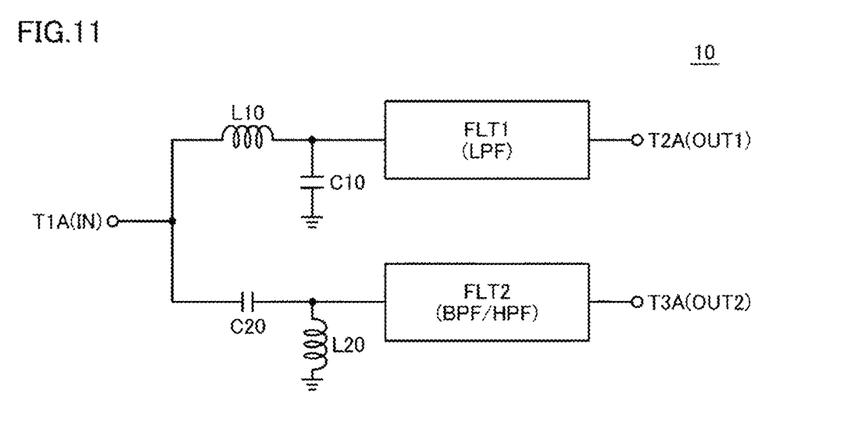
FIG. 11 is a block diagram illustrating an example of a diplexer according to Preferred Embodiment 2 of the present invention.

FIG. 11 is a block diagram illustrating an overview of a diplexer 10 according to Preferred Embodiment 2. With reference to FIG. 11, the diplexer 10 includes an input terminal T1A, two output terminals T2A and T3A, filters FLT1 and FLT2, inductors L10 and L20, and capacitors C10 and C20.

The filter FLT1 is connected between the input terminal T1A and the output terminal T2A. The filter FLT1 is a low pass filter (LPF) that allows signals in a frequency band lower than a predetermined frequency to pass, and the same or substantially the same configuration as that of the LC filter described in Preferred Embodiment 1 or any of the modifications is applicable thereto.

In the inductor L10, one end is connected to the input terminal T1A, and the other end is connected to the filter FLT1. The capacitor C10 is connected between the ground potential and a connection node between the inductor L10 and the filter FLT1. The inductor L10 and the capacitor C10 define a low pass filter and define and function as a branch circuit for high-frequency signals received by the input terminal T1A.

In contrast, the filter FLT2 is connected between the input terminal T1A and the output terminal T3A. The filter FLT2 is a high pass filter (HPF) or a band pass filter (BPF) that allows signals in a frequency band higher than the pass band for the filter FLT1 to pass.

In the capacitor C20, one end is connected to the input terminal T1A, and the other end is connected to the filter FLT2. The inductor L20 is connected between the ground potential and a connection node between the capacitor C20 and the filter FLT2. The inductor L20 and the capacitor C20 define a high pass filter and define and function as a branch circuit for high-frequency signals received by the input terminal T1A.

Figure 12:
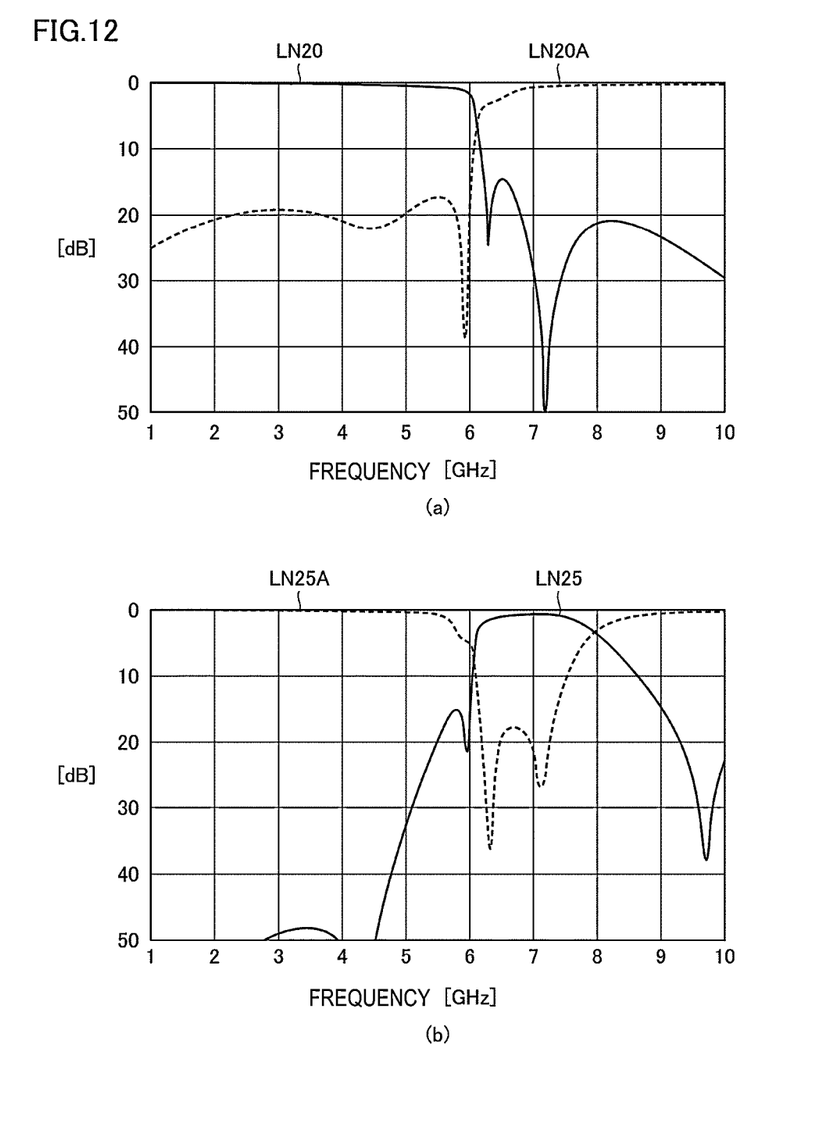
FIG. 12 illustrates graphs for explaining the bandpass characteristics of the diplexer in FIG. 11.

FIG. 12 illustrates graphs illustrating an example of the bandpass characteristics of the diplexer in FIG. 11. FIG. 12A in the higher portion illustrates insertion loss (solid line LN20) and return loss (broken line LN20A) in the filter FLT1 on the low frequency side. FIG. 12B in the lower portion illustrates insertion loss (solid line LN25) and return loss (broken line LN25A) in the filter FLT2 on the high frequency side. In this example in the diplexer 10, a band from about 0 MHz to about 5950 MHz is set as the pass band of the filter FLT1, and a band from about 6240 MHz to about 8240 MHz is set as the pass band of the filter FLT2.

With reference to FIG. 12A, an insertion loss in the end portion (for example, about 5950 MHz) on the high frequency side of the pass band for the filter FLT1 is about 1.3 dB, and an insertion loss in the end portion (for example, about 6240 MHz) on the low frequency side of the pass band for the filter FLT2 is about 20 dB. In addition, an attenuation pole attributable to a resonant circuit caused by cross-coupling is provided around 7200 MHz, and about 15 dB or higher is observed as an attenuation characteristic over the entire pass band of the filter FLT2. In addition, a return loss of the filter FLT1 is about 15 dB or lower over the entire pass band thereof. Accordingly, low loss is achieved in the pass band, and a high attenuation characteristic is preferable in the non-bandpass characteristics.

The configuration of the filter FLT2 is not particularly stipulated in the present application, but as illustrated in the example in FIG. 12B, an insertion loss in the end portion (for example, about 6240 MHz) on the low frequency side of the pass band in the filter FLT2 is about 1.3 dB, and an insertion loss in the end portion (for example, about 5950 MHz) on the high frequency side of the pass band in the filter FLT1 is about 20 dB. Accordingly, in the filter FLT2, a high attenuation characteristic is achieved in the non-pass band between the filter FLT1 and the filter FLT2.

As described above, by applying the LC filter described in any one of Preferred Embodiment 1 and the modifications to the low pass filter in the diplexer, a diplexer having low loss and a high attenuation characteristic can be achieved.

The "filter FLT1" and the "filter FLT2" in Preferred Embodiment 2 respectively correspond to a "first filter" and a "second filter".

Preferred Embodiment 3

In Preferred Embodiment 3 of the present invention, an example in which the LC filter described in any one of Preferred Embodiment 1 and the modifications is applied to a multiplexer including three or more filters will be described.

Figure 13:
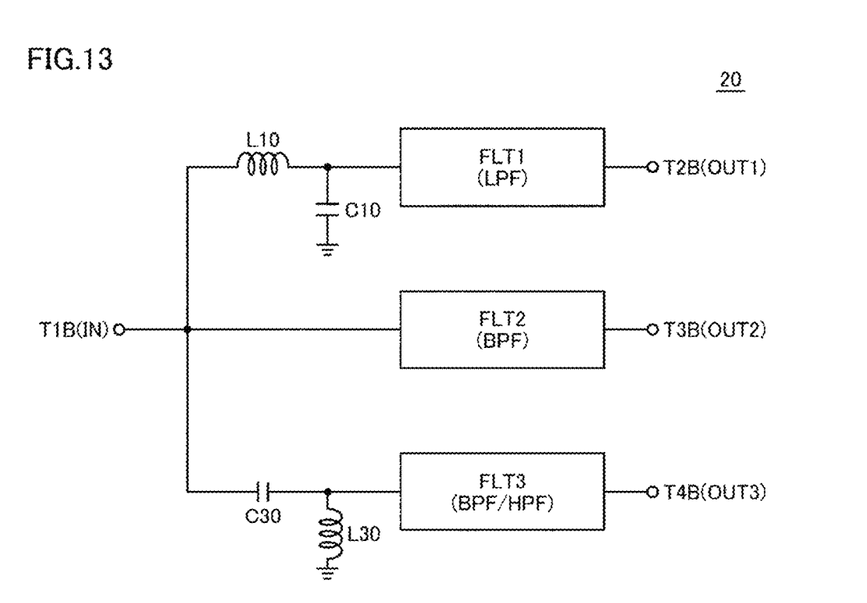
FIG. 13 is a block diagram illustrating an example of a multiplexer according to Preferred Embodiment 3 of the present invention.

FIG. 13 is a block diagram illustrating an overview of a multiplexer 20 according to Preferred Embodiment 3. With reference to FIG. 13, the multiplexer 20 includes an input terminal T1B, three output terminals T2B, T3B, and T4B, the filters FLT1 and FLT2, a filter FLT3, the inductor L10, an inductor L30, the capacitor C10, and a capacitor C30.

The filter FLT1 is connected between the input terminal T1B and the output terminal T2B. The filter FLT1 is a low pass filter (LPF) that allows signals in a frequency band lower than a predetermined frequency, and the same or substantially the same configuration as that of the LC filter described in any one of Preferred Embodiment 1 and the modifications is applicable thereto.

In the inductor L10, one end is connected to the input terminal T1B, and the other end is connected to the filter FLT1. The capacitor C10 is connected between the ground potential and the connection node between the inductor L10 and the filter FLT1. The inductor L10 and the capacitor C10 define a low pass filter and define and function as a branch circuit for high-frequency signals received by the input terminal T1B.

The filter FLT2 is connected between the input terminal T1B and the output terminal T3B. The filter FLT2 is a band pass filter (BPF) that allows signals in a frequency band higher than the pass band for the filter FLT1 to pass.

The filter FLT3 is connected between the input terminal T1B and the output terminal T4B. The filter FLT3 is one of a high pass filter (HPF) and a band pass filter (BPF) that allow signals in a frequency band further higher than the pass band for the filter FLT2.

In the capacitor C30, one end is connected to the input terminal T1B, and the other end is connected to the filter FLT3. The inductor L30 is connected between the ground potential and a connection node between the capacitor C30 and the filter FLT3. The inductor L30 and the capacitor C30 form a high pass filter and function as a branch circuit for high-frequency signals received by the input terminal T1B.

In the multiplexer as described above, by applying the LC filter described in any one of Preferred Embodiment 1 and the modifications to the low pass filter provided to a path for a signal in the lowest frequency band to pass, a multiplexer having low loss and a high attenuation characteristic can be achieved.

The "filter FLT1" to the "filter FLT3" in Preferred Embodiment 3 respectively correspond to the "first filter" to a "third filter".

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LC filter comprising:
a multilayer body including a plurality of dielectric layers that are stacked;
a first electrode and a second electrode each having a plate shape and provided in different dielectric layers in the multilayer body;
a first capacitor electrode, a second capacitor electrode, and a third capacitor electrode each defining a capacitor between the second electrode and a corresponding one of the first capacitor electrode, the second capacitor electrode, and the third capacitor electrode;
a first inductor via including an end connected to the first capacitor electrode and another end coupled to the first electrode;
a second inductor via including an end connected to the second capacitor electrode and another end connected to the first electrode;
a third inductor via including an end connected to the third capacitor electrode and another end coupled to the first electrode;
a fourth capacitor electrode facing the first capacitor electrode and the second capacitor electrode;
a fifth capacitor electrode facing the second capacitor electrode and the third capacitor electrode; and
a sixth capacitor electrode facing the third capacitor electrode and the first capacitor electrode.

2. The LC filter according to claim 1, wherein
the first capacitor electrode, the second capacitor electrode, and the third capacitor electrode are provided in a first dielectric layer between the first electrode and the second electrode; and
the fourth capacitor electrode, the fifth capacitor electrode, and the sixth capacitor electrode are provided in a second dielectric layer between the first electrode and the first dielectric layer.

3. The LC filter according to claim 1, wherein
each of the first inductor via, the second inductor via, and the third inductor via includes at least one via conductor; and
a number of the via conductors of the second inductor via is greater than a number of the via conductors of the first inductor via and a count of the via conductors of the third inductor via.

4. The LC filter according to claim 1, wherein an inductance of the second inductor via is lower than an inductance of the first inductor via and an inductance of the third inductor via.

5. The LC filter according to claim 1, further comprising:
a first coil connected between the first inductor via and the first electrode; and
a second coil connected between the third inductor via and the first electrode.

6. The LC filter according to claim 1, wherein the multilayer body is made of a ceramic.

7. The LC filter according to claim 1, wherein the LC filter defines and functions as a low pass filter that allows a signal in a frequency band lower than a specific frequency to pass.

8. The LC filter according to claim 1, wherein, in a plan view seen from a stacking direction of the multilayer body, at least one first cutout portion crossing a linear path connecting the first inductor via and the second inductor via and at least one second cutout portion crossing a linear path connecting the second inductor via and the third inductor via are provided in the first electrode.

9. The LC filter according to claim 8, wherein
the first electrode includes:
a first region to which the first inductor via is connected;
a second region to which the second inductor via is connected; and
a third region to which the third inductor via is connected;
in the plan view from the stacking direction of the multilayer body, a minimum width of the first region is narrower than a minimum width of the second region, and a minimum width of the third region is narrower than the minimum width of the second region.

10. The LC filter according to claim 9, wherein
each of the first region and the third region includes a first portion with a first line width and a second portion with a second line width narrower than the first line width; and
the first portion is closer to the second region than the second portion is to the second region.

11. The LC filter according to claim 8, wherein, in the plan view seen from the stacking direction of the multilayer body, the first electrode has an S-letter shape or substantially an S-letter shape.

12. A diplexer comprising:
a first filter including the LC filter according to claim 1; and
a second filter that allows a signal in a frequency band higher than a pass band for the first filter to pass.

13. The diplexer according to claim 12, wherein
the first capacitor electrode, the second capacitor electrode, and the third capacitor electrode are provided in a first dielectric layer between the first electrode and the second electrode; and
the fourth capacitor electrode, the fifth capacitor electrode, and the sixth capacitor electrode are provided in a second dielectric layer between the first electrode and the first dielectric layer.

14. The diplexer according to claim 12, wherein
each of the first inductor via, the second inductor via, and the third inductor via includes at least one via conductor; and
a number of the via conductors of the second inductor via is greater than a number of the via conductors of the first inductor via and a count of the via conductors of the third inductor via.

15. The diplexer according to claim 12, wherein an inductance of the second inductor via is lower than an inductance of the first inductor via and an inductance of the third inductor via.

16. The diplexer according to claim 12, wherein, in a plan view seen from a stacking direction of the multilayer body, at least one first cutout portion crossing a linear path connecting the first inductor via and the second inductor via and at least one second cutout portion crossing a linear path connecting the second inductor via and the third inductor via are provided in the first electrode.

17. A multiplexer comprising:
a first filter including the LC filter according to claim 1; and
a second filter that allows a signal in a frequency band higher than a pass band for the first filter to pass; and
a third filter that allows a signal in a frequency band higher than a pass band for the second filter to pass.

18. The multiplexer according to claim 17, wherein
the first capacitor electrode, the second capacitor electrode, and the third capacitor electrode are provided in a first dielectric layer between the first electrode and the second electrode; and
the fourth capacitor electrode, the fifth capacitor electrode, and the sixth capacitor electrode are provided in a second dielectric layer between the first electrode and the first dielectric layer.

19. The multiplexer according to claim 17, wherein
each of the first inductor via, the second inductor via, and the third inductor via includes at least one via conductor; and
a number of the via conductors of the second inductor via is greater than a number of the via conductors of the first inductor via and a count of the via conductors of the third inductor via.

20. The multiplexer according to claim 17, wherein an inductance of the second inductor via is lower than an inductance of the first inductor via and an inductance of the third inductor via.

* * * * *